(12) United States Patent
Fujii

(10) Patent No.: US 6,225,180 B1
(45) Date of Patent: May 1, 2001

(54) SEMICONDUCTOR DEVICE AND METHOD OF MANUFACTURING THE SAME

(75) Inventor: Hidenori Fujii, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/588,310

(22) Filed: Jun. 6, 2000

Related U.S. Application Data

(62) Division of application No. 09/111,784, filed on Jul. 8, 1998, now Pat. No. 6,114,742.

(30) Foreign Application Priority Data

Jan. 19, 1998 (JP) .................................................. 10-006866

(51) Int. Cl.$^7$ ................................................. H01L 21/331
(52) U.S. Cl. .................... 438/350; 438/353; 438/362; 438/370; 438/372; 438/376; 438/373
(58) Field of Search .................... 438/372–377, 438/370, 350, 353, 362

(56) References Cited

U.S. PATENT DOCUMENTS 5,780,329 * 7/1998 Randazzo et al. .................... 438/202

5,885,880 * 3/1999 Gomi .................................. 438/322

FOREIGN PATENT DOCUMENTS

| 3-89555 | 4/1991 | (JP) . |
| 9-51045 | 2/1997 | (JP) . |

* cited by examiner

*Primary Examiner*—Eddie C. Lee
*Assistant Examiner*—N. Drew Richards
(74) *Attorney, Agent, or Firm*—McDermott, Will & Emery

(57) ABSTRACT

A photoresist pattern is formed on a field oxide film and an element forming region across the field oxide film and the element forming region such that a portion of a surface of the field oxide film and a portion of a surface of a silicon epitaxial layer are continuously exposed. The photoresist pattern is used as a mask to inject boron ions into the silicon epitaxial layer and heat treatment is performed thereon to form an external base containing the relatively significant crystal defect present in the silicon epitaxial layer in the vicinity of the field oxide film. Thus, a semiconductor device can be obtained including a bipolar transistor which provides improved breakdown voltage between the collector and the base and contemplates reduction of current leakage.

4 Claims, 17 Drawing Sheets

SEMICONDUCTOR DEVICE AND METHOD OF MANUFACTURING THE SAME

This application is a Divisional of Application Ser. No. 09/111,784 filed Jul. 8, 1998 is now U.S. Pat. No. 6,114,742.

BACKGROUND OF THE INVENTION

1. Field of the Invention

The present invention relates to semiconductor devices and a method of manufacturing the same, and in particular to semiconductor devices and a method of manufacturing the same contemplating improvement of breakdown voltage and reduction of leakage current.

2. Description of the Background Art

A method of manufacturing a bipolar transistor as an exemplary conventional semiconductor device will now be described with reference to the drawings.

Referring first to FIG. 18, an n silicon epitaxial layer 102 is formed on a silicon substrate 101. Formed on silicon epitaxial layer 102 is a field oxide film 103 for forming an element region 102a. A polysilicon layer 104 is formed such that it covers field oxide film 103.

Referring now to FIG. 19, ion injection is employed to inject boron ions into polysilicon layer 104. The injected boron ions are held in polysilicon layer 104 at an impurity ion holding layer 105. Referring now to FIG. 20, chemical vapor deposition is employed to form an insulation layer 106 of e.g. Tetra Ethyl Ortho Silicate Glass (TEOS) on polysilicon layer 104. A predetermined photoresist pattern (not shown) is formed on insulation layer 106. The photoresist pattern is used as a mask to anisotropically etch insulation layer 106 and the polysilicon layer including impurity ion holding layer 105 so that an opening 107 is formed to expose a surface of silicon epitaxial layer 102. Thus, the polysilicon layer becomes a base extracting interconnection 4a.

Referring now to FIG. 21, heat treatment is provided to diffuse the boron ions held in impurity ion holding layer 105 into silicon epitaxial layer 102 to form an external base 105a. The heat treatment also allows formation of a silicon oxide film 108 at a side surface of opening 107 and a surface of silicon epitaxial layer 102.

Referring now to FIG. 22, insulation layer 106 is used as a mask for ion injection to inject boron ions into opening 107. The boron ions are held in silicon epitaxial layer 102 at a holding layer 109.

Referring now to FIG. 23, heat treatment is provided to diffuse the boron ions held in holding layer 109 into silicon epitaxial layer 102 to form an intrinsic base 109a.

Referring now to FIG. 24, chemical vapor deposition and the like is employed to form on insulation layer 106 a TEOS film (not shown) which fills opening 107. The TEOS film is anisotropically etched to form a sidewall 110a on a side surface of opening 107.

Referring now to FIG. 25, a polysilicon layer 111 is formed on insulation layer 106. Ion injection is employed to inject arsenic ions into polysilicon layer 111. The injected arsenic ions are held in polysilicon layer 111. Then, a predetermined photoresist pattern (not shown) is formed on polysilicon layer 111.

Referring now to FIG. 26, the photoresist pattern is used as a mask to anisotropically etch the polysilicon layer to form an emitter extracting interconnection 111a. Then, heat treatment is provided to diffuse the arsenic ions held in emitter extracting interconnection 111a into intrinsic base 109a to form an emitter 112a. The basic structure of the bipolar transistor is thus formed.

Referring now to FIG. 27, an interlayer insulating film 112 is formed to cover emitter extracting interconnection 111a and insulation layer 106. A predetermined photoresist pattern (not shown) is formed on interlayer insulating film 112. The photoresist pattern is used as a mask to anisotropically etch interlayer insulating film 112 to form an opening 113a exposing a surface of silicon epitaxial layer 102, an opening 113b exposing a surface of base extracting interconnection 104a, and an opening 113c exposing a surface of emitter extracting interconnection 111a.

Referring now to FIG. 28, an aluminum layer (not shown) is formed by e.g. sputtering on interlayer insulating film 112 to fill openings 113a, 113b and 113c. A predetermined photoresist pattern (not shown) is formed on the aluminum layer. The photoresist pattern is used as a mask to etch the aluminum layer to form a collector interconnection 114, an emitter interconnection 115 and a base interconnection 116. Thus, a semiconductor device including a bipolar transistor is thus completed.

The bipolar transistor obtained according to the manufacturing method described above, however, has the following disadvantages. External base 105a shown in FIG. 28 is formed by performing a heat treatment in the step shown in FIG. 21 to provide thermal diffusion of the boron ions held in base extracting interconnection 104a into silicon epitaxial layer 102. Thus, the boron ions are not diffused sufficient deeply into silicon epitaxial layer 102 in the vicinity of an edge of field oxide film 103. As a result, a length L of external base 105a in the vicinity of the edge of field oxide film 103 can be reduced, as shown in FIG. 29.

Furthermore, silicon epitaxial layer 102 in the vicinity of the edge of field oxide film 103 has relatively significant crystal defect and the like caused by the stress which is caused in forming field oxide film 103. Thus, there is significant crystal defect and the like in the vicinity of the junction interface between external base 105a in the vicinity of field oxide film 103 and silicon epitaxial layer 102. As a result, the breakdown voltage between external base 105a and silicon epitaxial layer 102 can be reduced, resulting in leakage of current and hence disadvantageous degradation of the electrical characteristics of the bipolar transistor.

SUMMARY OF THE INVENTION

The present invention has been made to solve the disadvantages described above.

One object of the present invention is to provide a bipolar transistor capable of restricting any drop of the breakdown voltage between external base 105a and silicon epitaxial layer 102 as a collector to reduce current leakage.

Another object of the present invention is to provide a method of manufacturing the same.

A method of manufacturing a semiconductor device in one aspect of the present invention includes the steps of: forming at a main surface of a semiconductor substrate a first element forming region formed of a region of a first conduction type electrically insulated from other regions by a first element isolating film; forming a first photoresist pattern across the first element isolating film and the first element forming region such that a portion of a surface of the first element isolating film and a portion of a surface of the region of the first conduction type are continuously exposed; and forming a first impurity region of a second conduction type in the region of the first conduction type at a region including a main surface of the region of the first conduction type and a portion exactly underlying the first element isolating film and a portion in a vicinity of the portion exactly underlying the first element isolating film by introducing an impurity of the second conduction type into the semiconductor substrate with the first photoresist pattern used as a mask.

According to this manufacturing method, the first impurity region is deeply formed across a vicinity of a main surface of the region of the first conduction type and the region of the first conduction type exactly underlying the first element isolating film and a portion in a vicinity thereof such that the first impurity region includes that portion in the vicinity of an edge of the first element isolating film at which relatively large stress is concentrated. Thus, significant crystal defect is present in the first impurity region, while crystal defect and the like are hardly present in the vicinity of the junction interface between the first impurity region and the region of the first conduction type. Thus, the breakdown voltage between the first impurity region and the region of the first conduction type can be improved to restrict current leakage from the first impurity region into the region of the first conduction type, resulting in a semiconductor device which contemplates reduction of current leakage.

The method preferably includes the step of forming the first impurity region followed by the steps of: forming at a main surface of the first element forming region a second impurity region of the second conduction type electrically connected to the first impurity region and having an impurity concentration lower than the impurity concentration of the first impurity region; and forming a third impurity region of the first conduction type shallower than the second impurity region within the second impurity region located at the main surface of the first element forming region.

In this example, the region of the first conduction type, the second impurity region and the third impurity region are formed at the first element forming region on the semiconductor substrate to configure a bipolar transistor. The bipolar transistor has the second impurity region electrically connected to the first impurity region to reduce the current leaking from the second impurity region through the first impurity region into the region of the first conductive type.

The method still preferably includes the steps of: forming at a main surface of the semiconductor substrate a second element forming region formed of a region of the second conduction type and electrically insulated from other regions by a second element isolating film; forming a second photoresist pattern across the second element isolating film and the second element forming region such that a surface of the second element isolating film and a surface of the region of the second conduction type are continuously exposed; and forming a fourth impurity region of the second conduction type higher in impurity concentration than the region of the second conduction type in the region of the second conduction type at a portion including a portion exactly underlying the second element isolating film and a portion in the vicinity of the region exactly underlying the second element isolating film by introducing an impurity of the second conduction type into the region of the second conduction type with the first and second photoresist patterns used as masks; wherein the step of forming the second photoresist pattern is provided simultaneously with the step of forming the first photoresist pattern, and the steps of forming the fourth and first impurity regions are simultaneously provided by introducing an impurity of the second conduction type with the second photoresist patterns used as mask.

In this example, the fourth impurity region formed at the region of the second conduction type improves the electrical insulation between the first and second element forming regions. The second photoresist pattern is formed simultaneously with the first photoresist pattern and the fourth impurity region is formed simultaneously with the first impurity region. Thus, a semiconductor device superior in electrical insulation can be obtained without increasing the number of the process steps.

A semiconductor device in another aspect of the present invention includes a region of a first conduction type, a first element forming region, and a first impurity region of a second conduction type. The region of the first conduction type is formed at a main surface of a semiconductor substrate. The first element forming region is formed at a main surface of the region of the first conduction type and is electrically insulated from other regions by an element isolating film. The first impurity region of the second conduction type at the region of the first conduction type across a region under the element isolating film and a surface of the element forming region in the vicinity of the element isolating film such that the first impurity region of the second conduction type includes crystal defect present in the region of the first conduction type in the vicinity of the element isolating film.

In this structure, the first impurity region is formed to include crystal defect caused concentratedly at the region of the first conduction type in the vicinity of an edge of the element isolating film. Thus, crystal defect is hardly present in the vicinity of the junction interface between the first impurity region and the region of the first conduction type. As a result, the breakdown voltage between the first impurity region and the region of the first conduction type can be improved to reduce current which leaks from the first impurity region into the region of the first conduction type through crystal defect and thus reduce current leakage in the semiconductor device.

The semiconductor device preferably includes a region of the second conduction type, a second element forming region, and a second impurity region of the second conduction type. The region of the second conduction type is formed at a main surface of the semiconductor substrate. The second element forming region is electrically insulated from the region of the first conduction type by an element isolating film. The second element forming region is formed at a surface of the region of the second conduction type. The second impurity region of the second conduction type is higher in impurity concentration than the region of the second conduction type and is formed simultaneously with the first impurity region in the region of the second conduction type at a portion including a portion underlying the element isolating film.

In this example, the second impurity region improves the electrical insulation between the first and second element forming regions. In addition, since the second impurity region is formed simultaneously with the first impurity region, the electrical insulation of the semiconductor device can be enhanced without increasing the number of process steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor device manufacturing method according to a first embodiment of the present invention, and a semiconductor device obtained by the manufacturing method will now be described with reference to the drawings.

Figure 1:
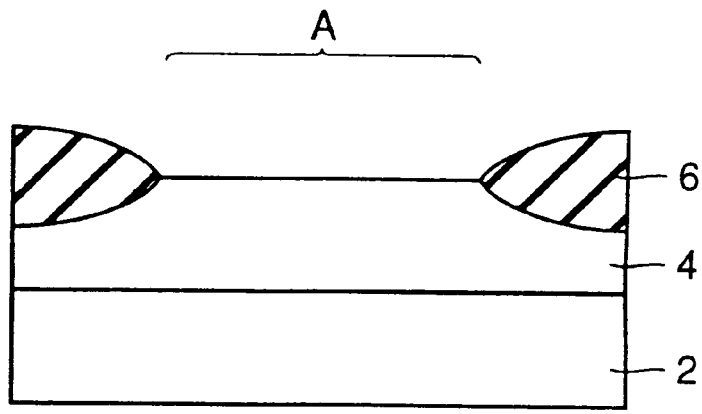
FIG. 1 is a cross section illustrating one step of a semiconductor device manufacturing method according to a first embodiment of the present invention.

Referring first to FIG. 1, an n silicon epitaxial layer 4 as a region of a first conduction type is formed on a silicon substrate 2 as a semiconductor substrate. Formed at silicon epitaxial layer 4 is a field oxide film 6 as a first element isolating film for forming an element forming region A as a first element forming region.

Figure 2:
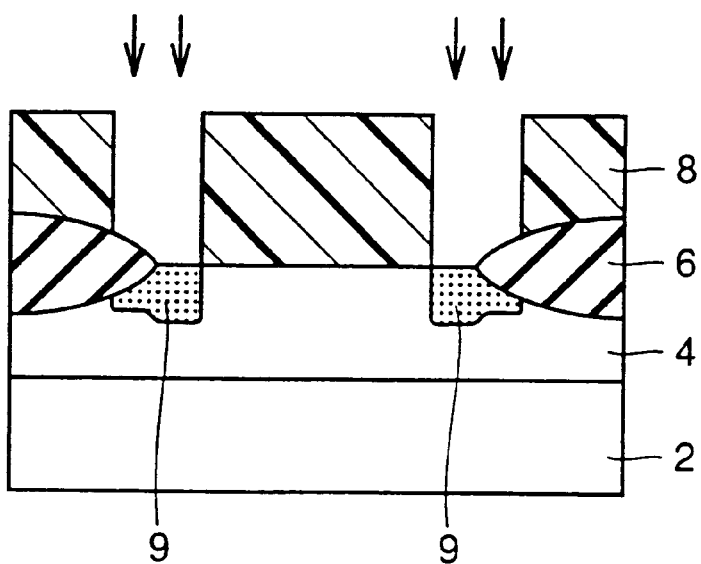
FIGS. 2–12 are cross sections illustrating steps provided after the steps shown in FIGS. 1–11, respectively.

Referring now to FIG. 2, a photoresist pattern 8 as a first photoresist pattern is formed across field oxide film 6 and element forming region A such that a portion of the surface of field oxide film 6 and a portion of the surface of silicon epitaxial layer 4 are continuously exposed. The photoresist pattern 8 is used as a mask for ion injection to inject boron ions with an energy of 40 to 80 keV and at a dose of $1\times10^{12}$ to $1\times10^{13}/cm^2$ so that a p impurity region 9 as a first impurity region is formed at a portion including a main surface of silicon epitaxial layer 4 and a portion exactly underlying field oxide film 6 and a portion in a vicinity of the portion exactly thereunder. Photoresist pattern 8 is then removed.

Figure 3:
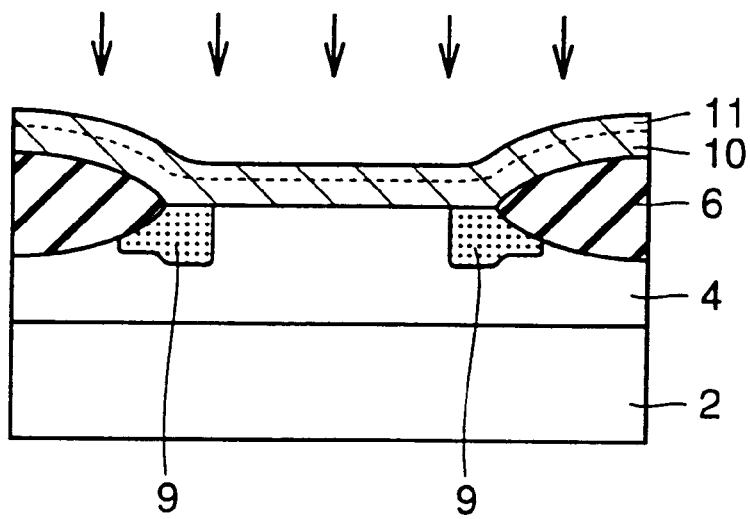

Referring now to FIG. 3, chemical vapor deposition is provided to form a polysilicon film 10 of 1000 to 5000 Å in thickness which covers field oxide film 6. Polysilicon film 10 is injected with boron ions with an energy of 20 to 50 keV and at a dose of $1\times10^{14}$ to $1\times10^{16}/cm^2$. The injected boron ions are held in polysilicon film 10 at an impurity ion holding layer 11.

Figure 4:
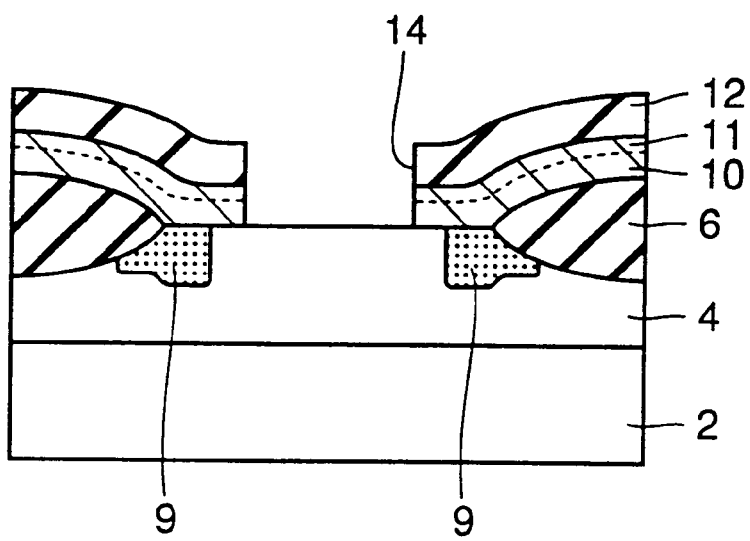

Referring now to FIG. 4, chemical vapor deposition is employed to form a silicon oxide film 12 of 1000 to 4000 Å in thickness on polysilicon film 10. A predetermined photoresist pattern (not shown) is formed on silicon oxide film 12. The photoresist pattern is used as a mask for anisotropically etching silicon oxide film 12 and polysilicon film 10 to form an opening 14 which exposes a surface of silicon epitaxial layer 4. Thus, the polysilicon film becomes a base extracting interconnection 10a.

Figure 5:
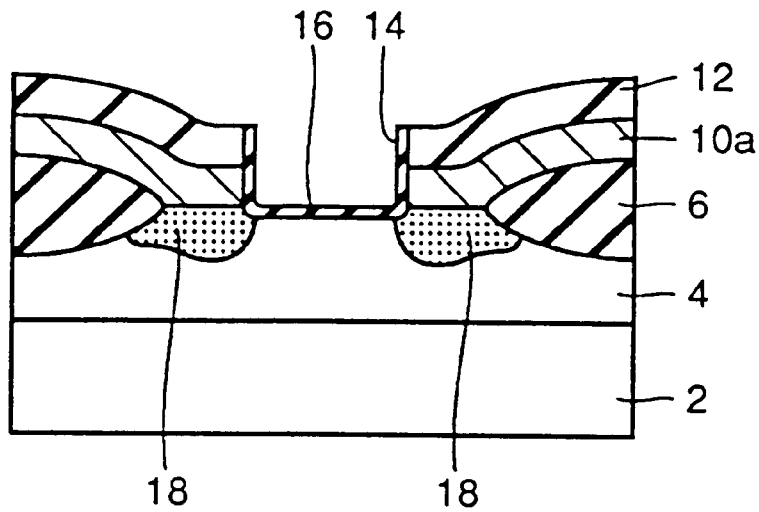

Referring now to FIG. 5, heat treatment is provided for one hour at a temperature of 800 to 900° C. to diffuse the boron ions held in impurity ion holding layer 11 into silicon epitaxial layer 4 to form an external base 18 which includes p impurity region 9. The boron in p impurity region 9 also reaches a deeper region through thermal diffusion. Meanwhile, a silicon oxide film 16 is also formed at a side surface of opening 14 and a surface of silicon epitaxial layer 4.

Figure 6:
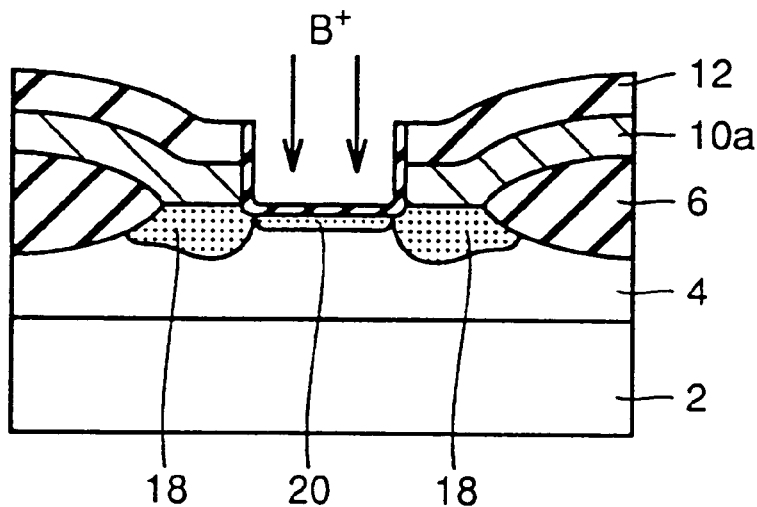

Referring now to FIG. 6, silicon oxide film 12 is used as a mask to provide ion injection so that opening 14 is injected with boron ions with an energy of 10 to 60 keV and at a dose of $1\times10^{14}$ to $1\times10^{16}/cm^2$. The boron ions are held in silicon epitaxial layer 4 at an impurity ion holding layer 20.

Figure 7:
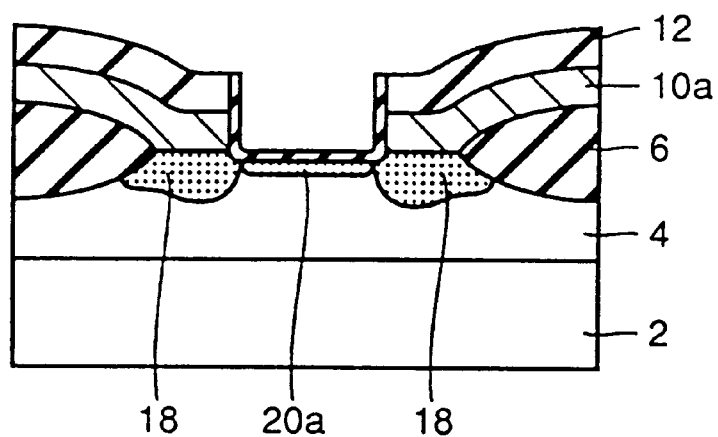

Referring now to FIG. 7, heat treatment is provided to diffuse the boron ions held in the impurity ion holding layer 20 into silicon epitaxial layer 4 to form an intrinsic base 20a as a second impurity region. Intrinsic base 20a is desirably lower in impurity concentration than external base 18. For example, it is desirable that the impurity concentration of external base 18 has an order of approximately $10^{18}$ to $10^{20}/cm^3$ and the impurity concentration of intrinsic base 20a has an order of $10^{16}$ to $10^{18}/cm^3$.

Figure 8:
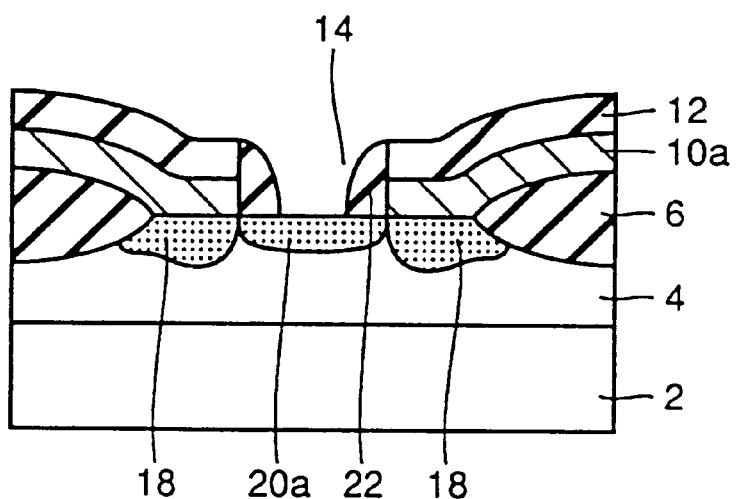

Referring now to FIG. 8, chemical vapor deposition or the like is employed to form a TEOS film (not shown) on silicon oxide film 12 to fill opening 14. The TEOS film is anisotropically etched to form a sidewall oxide film 22 at a side surface of opening 14.

Figure 9:
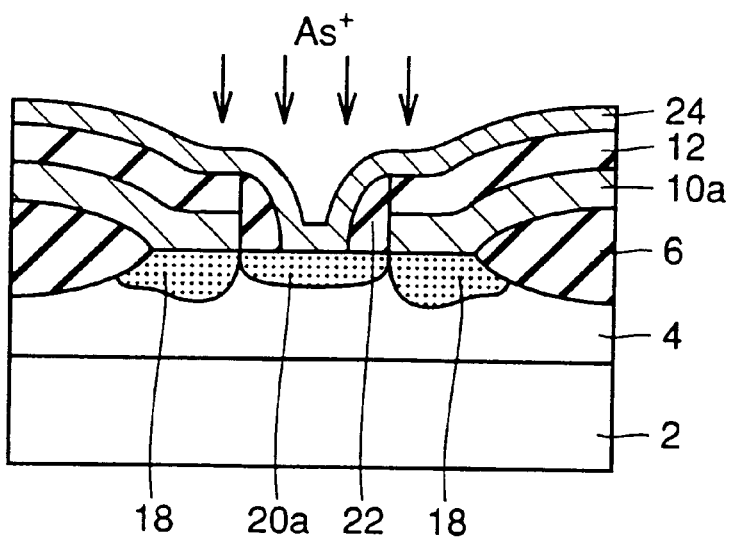

Referring now to FIG. 9, a polysilicon film 24 is formed on silicon oxide film 12. Ion injection is employed to inject arsenic ions into polysilicon film 24. Then a predetermined photoresist pattern (not shown) is formed on polysilicon film 24.

Figure 10:
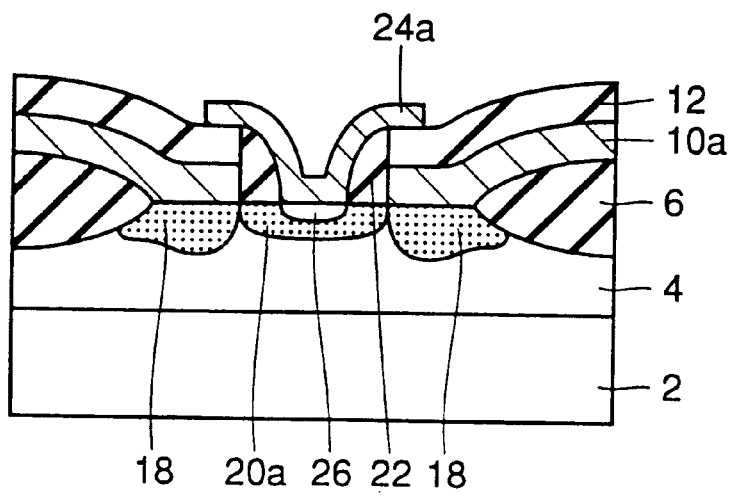

Referring now to FIG. 10, the photoresist pattern is used as a mask to anisotropically etch polysilicon film 24 to form an emitter extracting interconnection 24a. Then, heat treatment is provided to diffuse the arsenic ions held in emitter extracting interconnection 24a into intrinsic base 20a to form an emitter 26 as a third impurity region.

Figure 11:
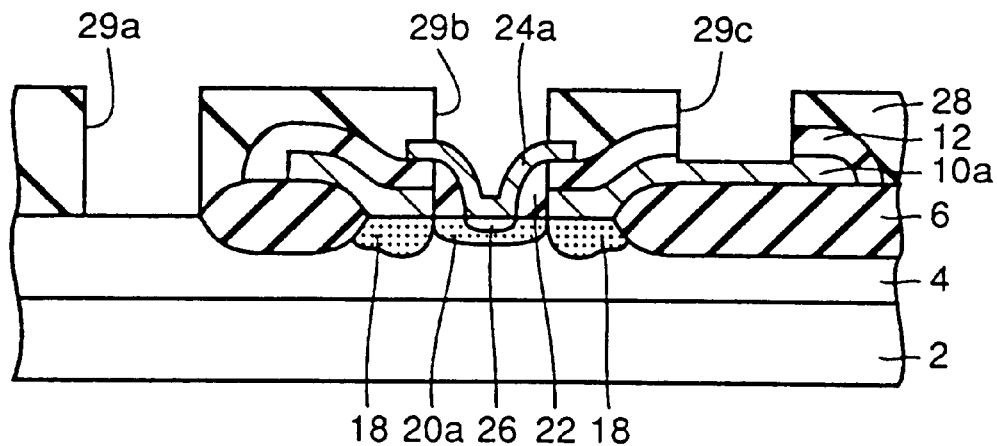

Referring now to FIG. 11, an interlayer insulating film 28 is formed to cover emitter extracting interconnection 24a and silicon oxide film 12. A predetermined photoresist pattern (not shown) is formed on interlayer insulating film 28. The photoresist pattern is used as a mask to anisotropically etch interlayer insulating film 28 to form an opening 29a which exposes a surface of silicon epitaxial layer 4, an opening 29b which exposes a surface of emitter extracting interconnection 24a, and an opening 29c which exposes a surface of base extracting interconnection 10a.

Figure 12:
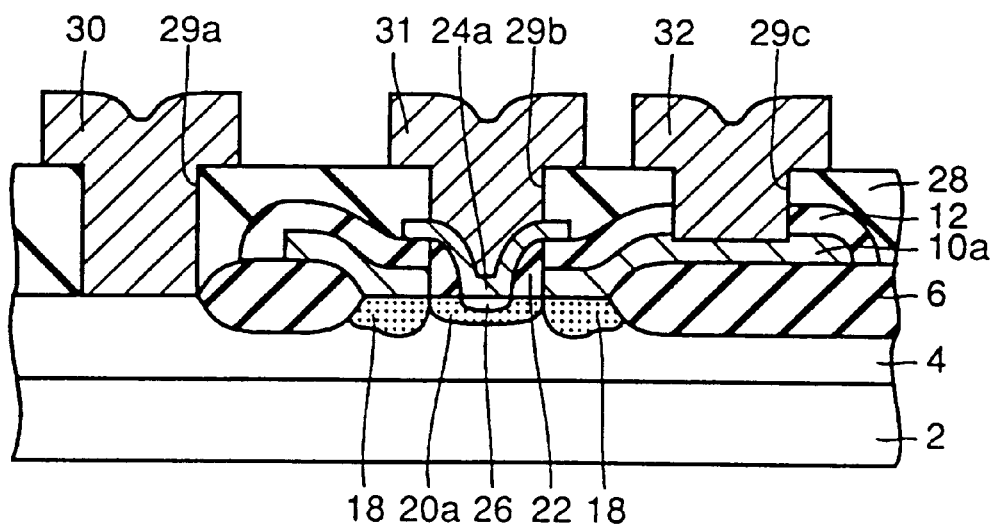

Referring now to FIG. 12, aluminum film is formed on interlayer insulating film 28 by e.g. sputtering to fill openings 29a, 29b and 29c. A predetermined photoresist pattern (not shown) is formed on the aluminum film. The photoresist pattern is used as a mask for anisotropically etching the aluminum film to form a collector interconnection 30 electrically connected to silicon epitaxial layer 4 as a collector, an emitter interconnection 31 electrically connected to emitter extracting interconnection 24a, and a base interconnection 32 electrically connected to base extracting interconnection 10a. A protection film (not shown) is formed on interlayer insulating film 28 to cover collector interconnection 30, emitter interconnection 31 and base interconnection 32. A bipolar transistor is thus completed.

According to the manufacturing method described above, when field oxide film 6 is formed in the step shown in FIG. 1, stress is concentrated and thus causes relatively significant crystal defect and the like at silicon epitaxial layer 4 near the edge of field oxide film 6. In the step shown in FIG. 2, p impurity region 9, formed by ion injection, is formed more deeply than by thermal diffusion of boron from a polysilicon film doped with the boron.

Thus, p impurity region 9 is formed so that it includes the region at which crystal defect is significantly generated. In other words, crystal defect is hardly present in the vicinity of the junction interface between p impurity region 9 and silicon epitaxial layer 4, and most of the crystal defect is present in p impurity region 9.

Furthermore, external base 18 obtained by providing heat treatment on p impurity region 9 allows the boron to be diffused to a deeper region and thus crystal defect is hardly present at the junction interface between external base 18 and silicon epitaxial layer 4. Consequently, the breakdown voltage between external base 18 and silicon epitaxial layer 4 as an emitter is improved to reduce current leakage from intrinsic base 20a through external base 18 to silicon epitaxial layer 4. Thus, a bipolar transistor is obtained-which contemplates reduction of current leakage.

Second Embodiment

A semiconductor device manufacturing method according to a second embodiment of the present invention, and a semiconductor device obtained by the manufacturing method will now be described with reference to the drawings. In this embodiment, a semiconductor device provided with a bipolar transistor and a MOS transistor is exemplified as a semiconductor device thereof.

Figure 13:
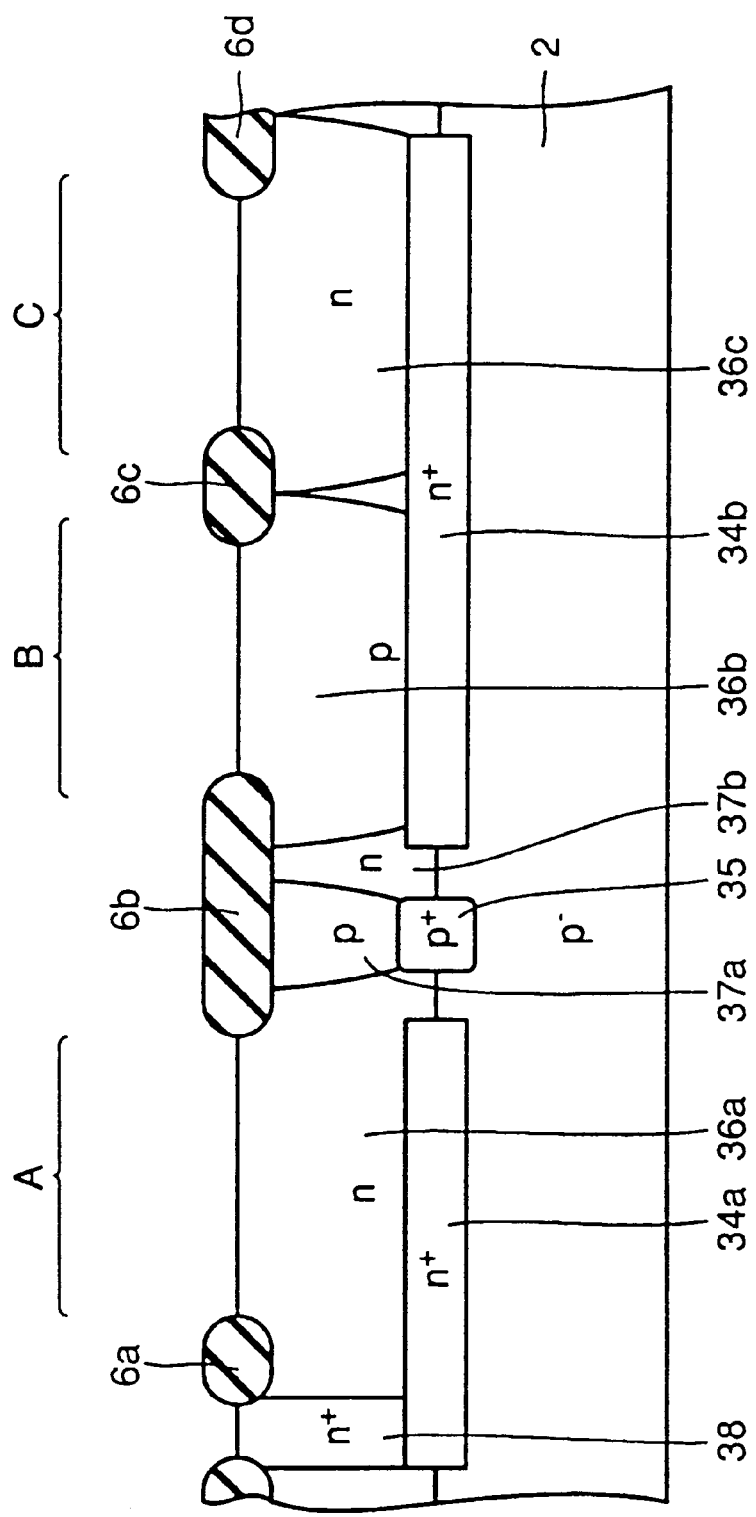
FIG. 13 is a cross section illustrating one step of a semiconductor device manufacturing method according to a second embodiment of the present invention.

Referring first to FIG. 13, a known method is employed to form $n^+$ buried layers 34a and 34b and a p buried layer 35 on a silicon substrate 2. An n silicon epitaxial layer 36a, 36c as a region of a first conduction type, and a p silicon epitaxial layer 36b as a region of a second conduction type are also formed. A collector contact layer 38 is also formed which is electrically connected to n silicon epitaxial layer 36a as a collector. An n element isolating layer 37b and a p element isolating layer 37a are formed.

A field oxide film 6a, 6b is formed as a first element isolating film for forming an element forming region A as a first element forming region. A field oxide film 6b, 6c is formed as a second element isolating film for forming an element forming region B as a second element forming region. Field oxide film 6c, 6d is formed for forming an element forming region C.

Figure 14:
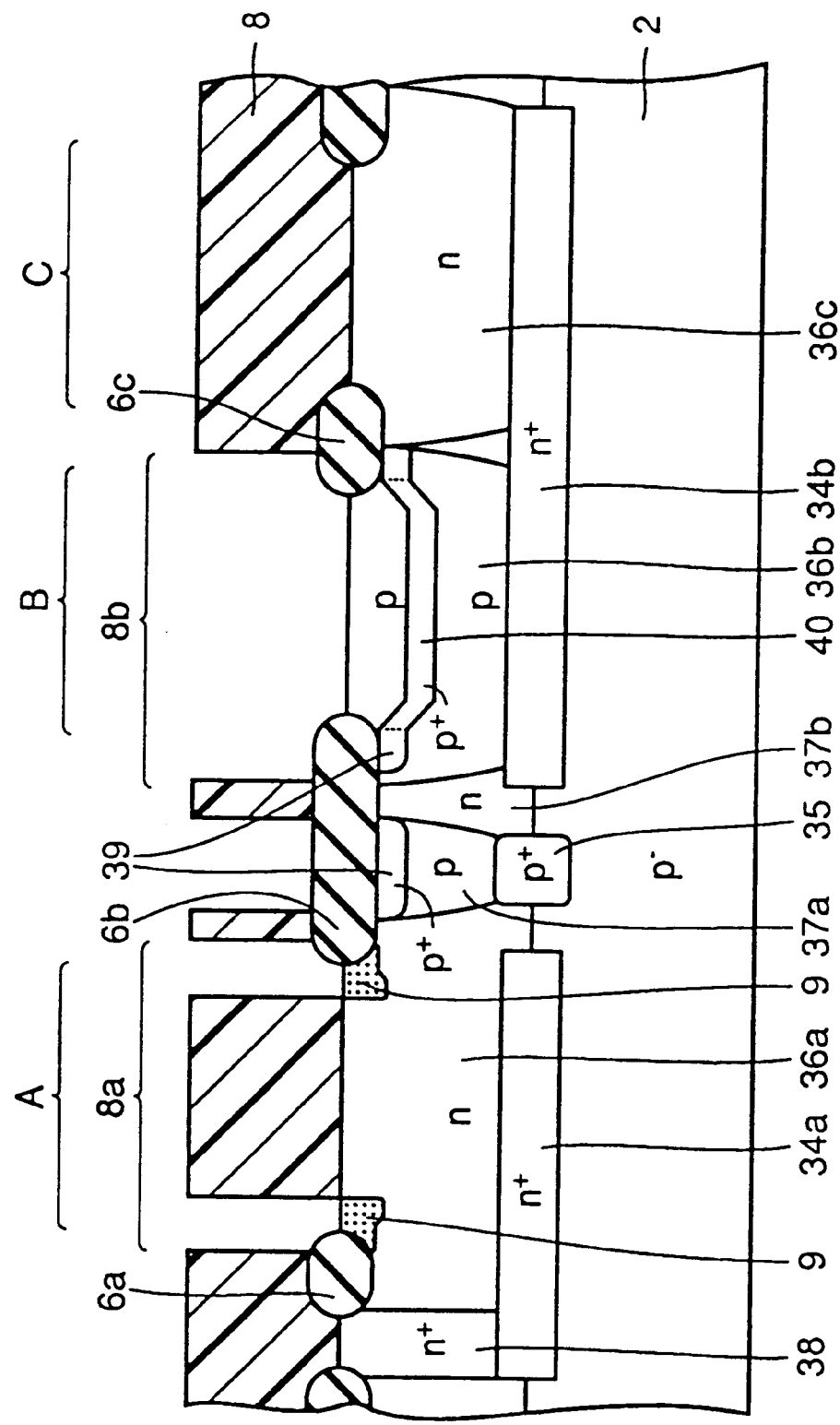
FIGS. 14–17 are cross sections illustrating steps provided after the steps shown in FIGS. 13–16, respectively.

Referring now to FIG. 14, photolithography using one predetermined photomask is employed to form a photoresist pattern 8a as a first photoresist pattern and a photoresist pattern 8b as a second photoresist pattern.

Photoresist pattern 8a is formed across field oxide film 6a and element forming region A such that a portion of a surface of field oxide film 6a and a portion of a surface of n silicon epitaxial layer 36a are continuously exposed. Photoresist pattern 8b is formed across field oxide film 6b providing electrical insulation between element forming regions A and B and element forming region B such that a surface of field oxide film 6b and a surface of p silicon epitaxial layer 36b are continuously exposed.

Photoresist patterns 8a and 8b are used as masks for injecting boron ions with an energy of 40 to 80 keV and at a dose of $1 \times 10^{12}$ to $1 \times 10^{13} cm^2$ to form a p impurity region 9 as a first impurity region at element forming region A, and a p channel dope 40 and a p channel cut 39 as a fourth impurity region at element forming region B. P channel cut 39 is formed in p silicon epitaxial layer 36b exactly under field oxide film 6b. P channel dope 40 is formed at a position deeper than p channel cut 39. P channel cut 39 is similarly formed in p element isolating layer 37a exactly under field oxide film 6b.

It should be noted that this boron ion injection step corresponds to the step shown in FIG. 2 described in the first embodiment. Also, it is desirable that p channel dope 40 and p channel cut 39 are higher in impurity concentration than p silicon epitaxial layer 36b. Photoresist patterns 8a and 8b are then removed.

Figure 15:
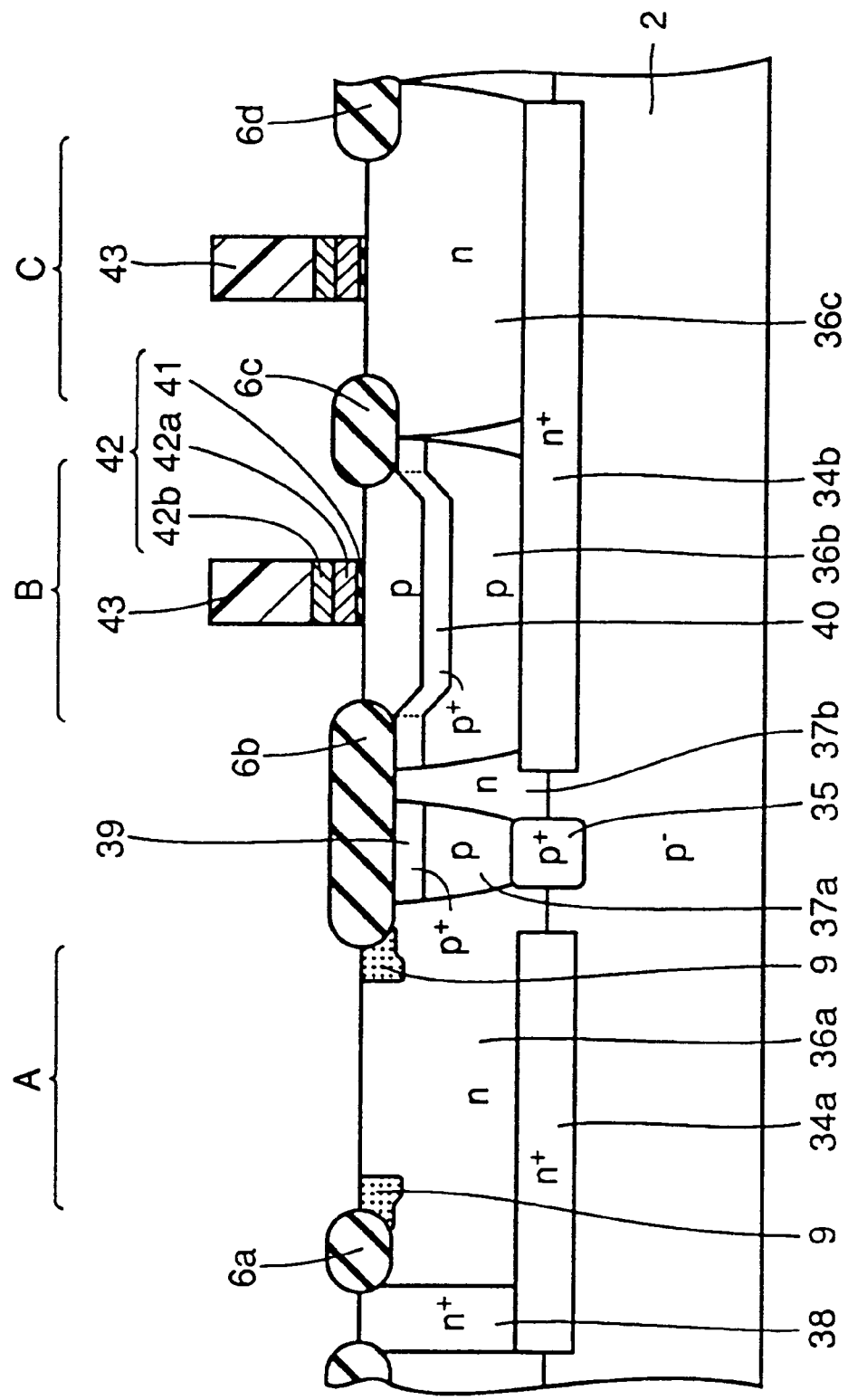

Referring now to FIG. 15, a silicon oxide film is interposed to cover field oxide films 6a, 6b, 6c and 6d, and a polysilicon film (not shown) and a tungsten silicide film (not shown) are deposited. The thickness of the polysilicon film is desirably 500 to 2000 Å. The thickness of the tungsten silicide film is desirably 1000 to 2000 Å. A predetermined photoresist pattern 43 is formed on the tungsten silicide film. Photoresist pattern 43 is used as a mask for anisotropically etching the tungsten silicide film and the polysilicon film to form a gate electrode 42 as a second electrode including a gate oxide film 41, a polysilicon film 42a and a tungsten silicide film 42b. Photoresist pattern 43 is then removed.

Figure 16:
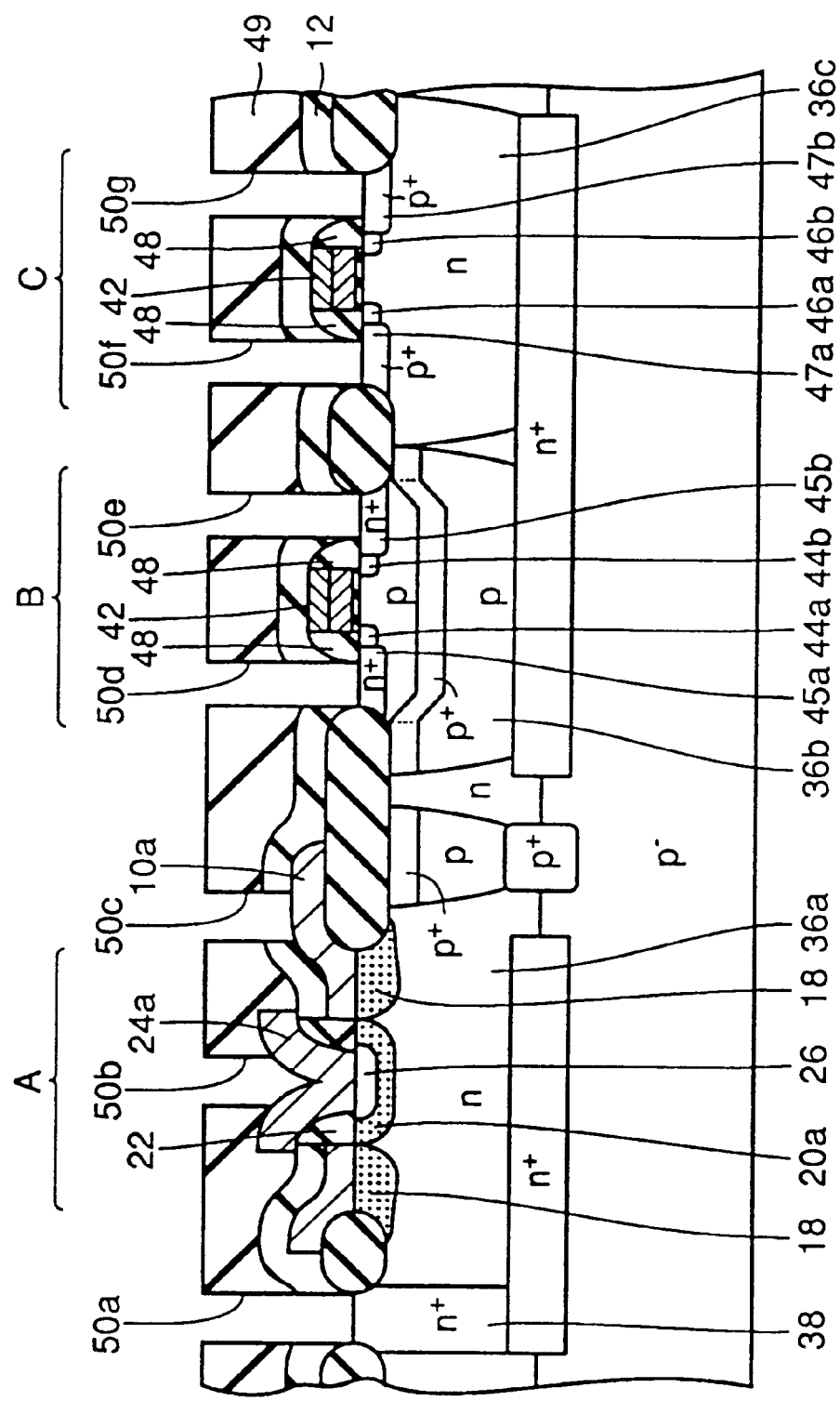

Referring now to FIG. 16, $n^-$ source/drain regions 44a and 44b and $n^+$ source/drain regions 45a and 45b as a third impurity region are formed at their respective surfaces of p silicon epitaxial layer 36b such that they sandwich gate electrode 42 in element forming region B. $P^-$ source/drain regions 46a and 46b and $p^+$ source/drain regions 47a and 47b are formed at their respective surfaces of n silicon epitaxial layer 36c such that they sandwich gate electrode 42 in element forming region C.

$N^-$ and $p^-$ source/drain regions 44a and 44b, and 46a and 46b are formed by using gate electrode 42 as a mask and injecting impurity ions of their respective predetermined conduction types. $N^+$ and $p^+$ source/drain regions 45a and 45b, and 47a and 47b are formed by using gate electrode 42 and sidewall oxide film 48 as a mask and injecting impurity ions of their respective predetermined conduction types. Thus, an n-channel MOS transistor is formed in element forming region B, and a p-channel MOS transistor is formed in element forming region C.

Furthermore, external base 18, intrinsic base 20a and emitter 26 are formed in element forming region A according to a manufacturing method similar to that described in the first embodiment. A base extracting interconnection 10a is formed which is electrically connected to external base 18. An emitter extracting interconnection 24a is formed which is electrically connected to emitter 26. A basic structure of the bipolar transistor is thus formed.

Then, a silicon oxide film 12 is formed which covers base extracting interconnection 10a and gate electrode 42. An interlayer insulating film 49 is formed on silicon oxide film 12. A predetermined photoresist pattern (not shown) is formed on interlayer insulating film 49. The photoresist pattern is used as a mask for anisotropically etching interlayer insulating film 49 and silicon oxide film 12 to form contact holes 50a, 50b, 50c, 50d, 50e, 50f and 50g which respectively expose a surface of collector contact layer 38, a surface of emitter extracting interconnection 24a, a surface of base extracting interconnection 10a, respective surfaces of $n^+$ source/drain regions 45a and 45b, and respective surfaces of $p^+$ source/drain regions 47a and 47b.

Figure 17:
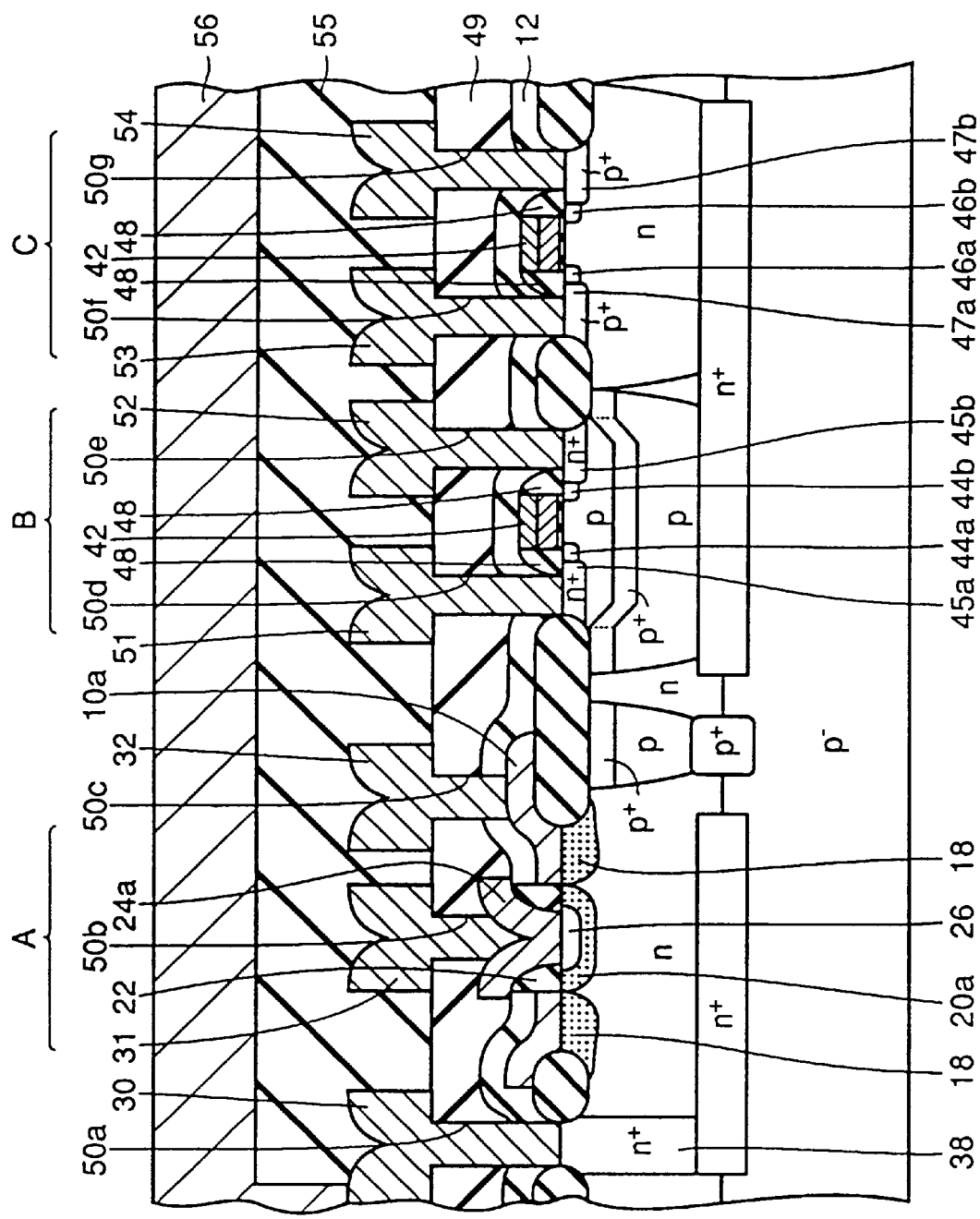
Figure 18:
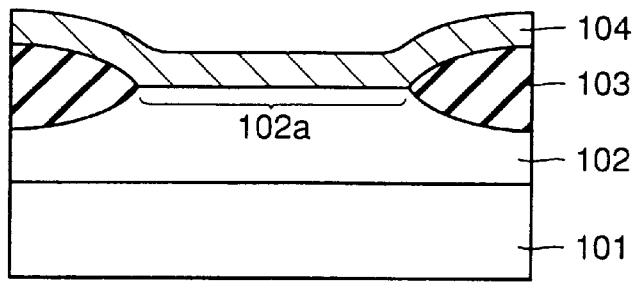
FIG. 18 is a cross section illustrating one step of a conventional semiconductor device manufacturing method.
Figure 19:
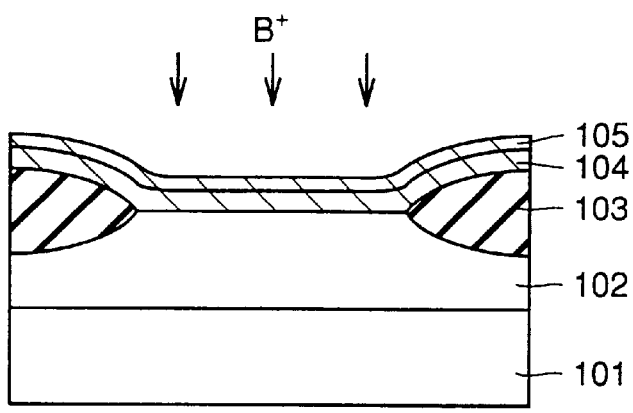
FIGS. 19–28 are cross sections illustrating steps provided after the steps shown in FIGS. 18–27, respectively.
Figure 20:
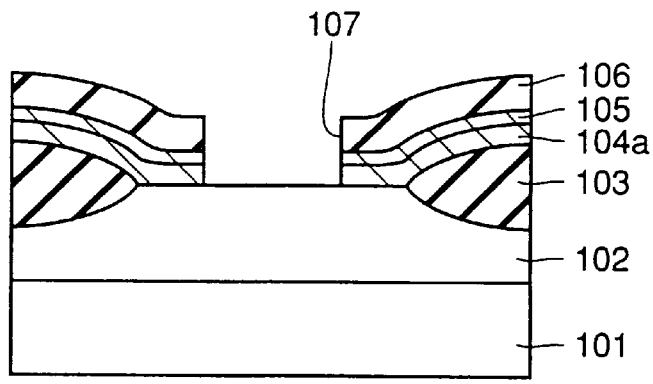
Figure 21:
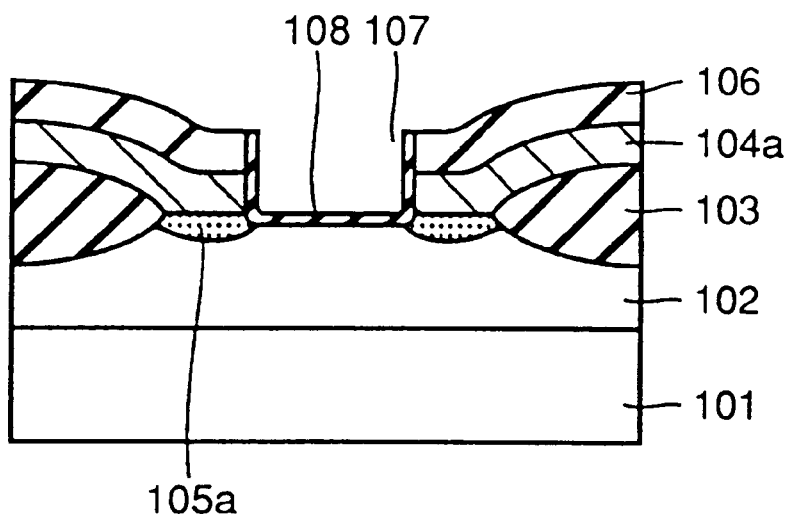
Figure 22:
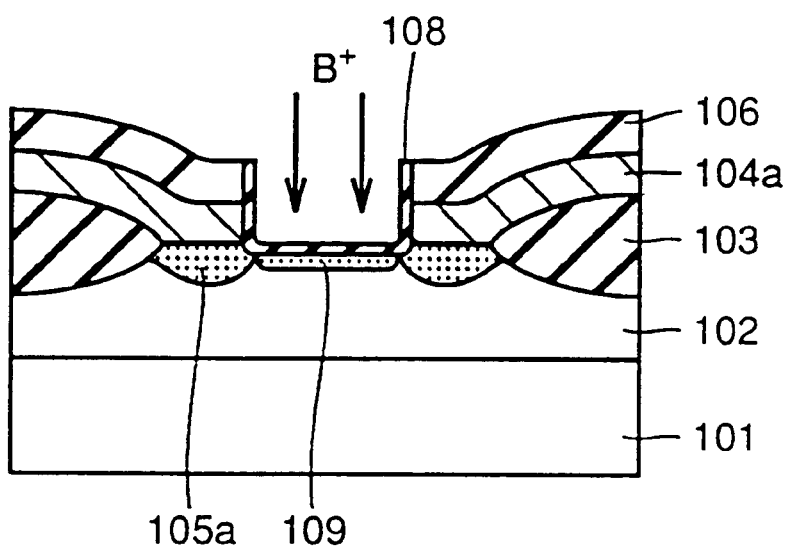
Figure 23:
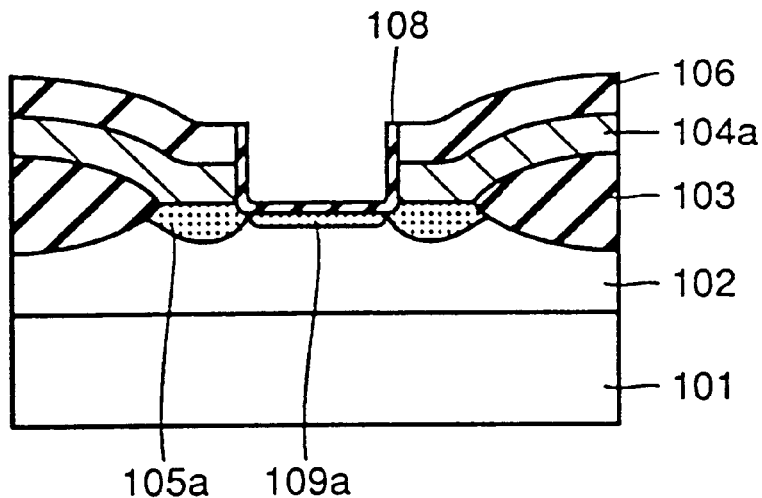
Figure 24:
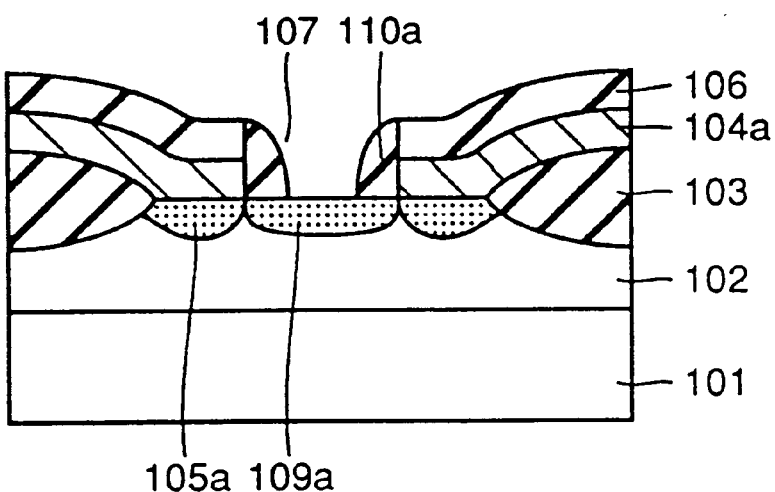
Figure 25:
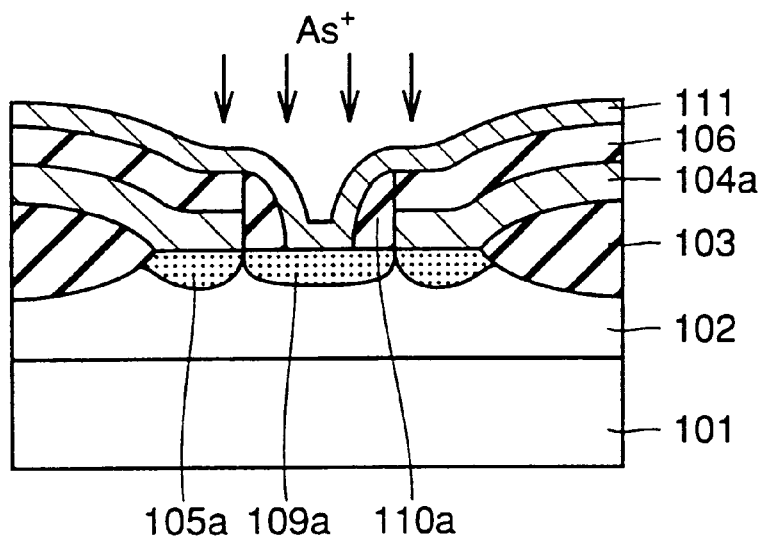
Figure 26:
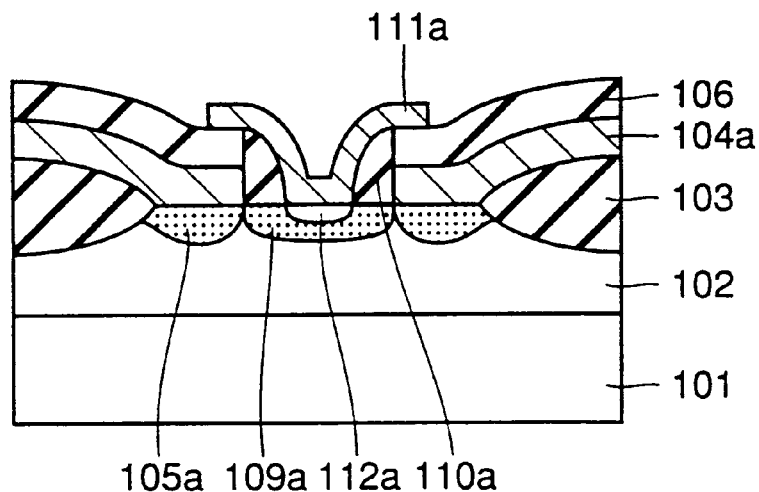
Figure 27:
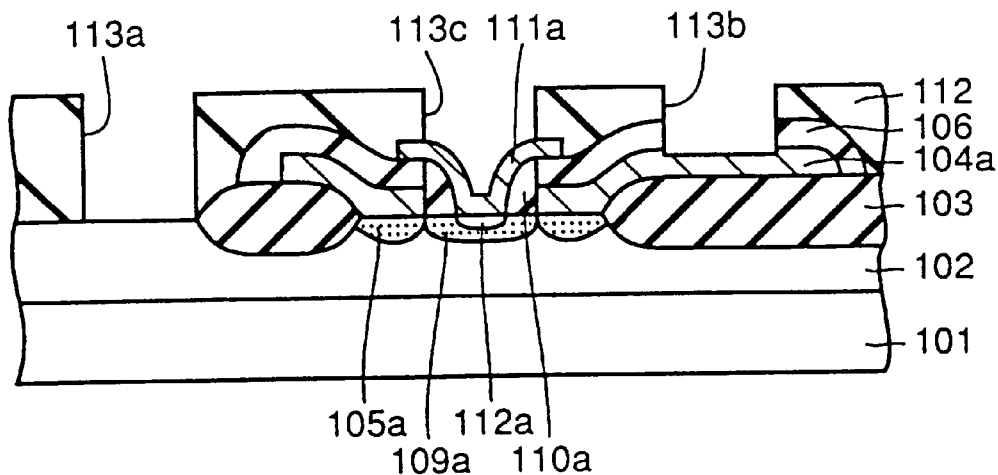
Figure 28:
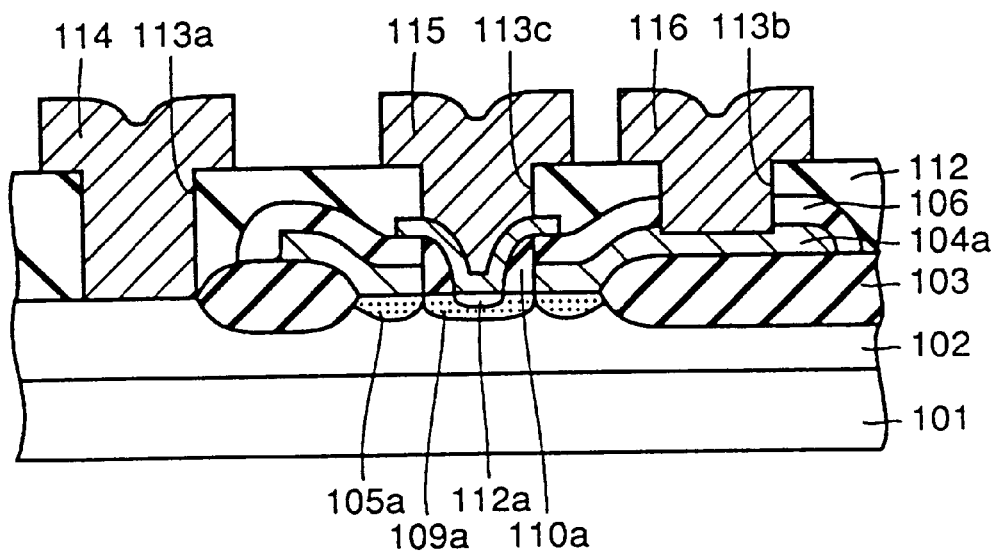
Figure 29:
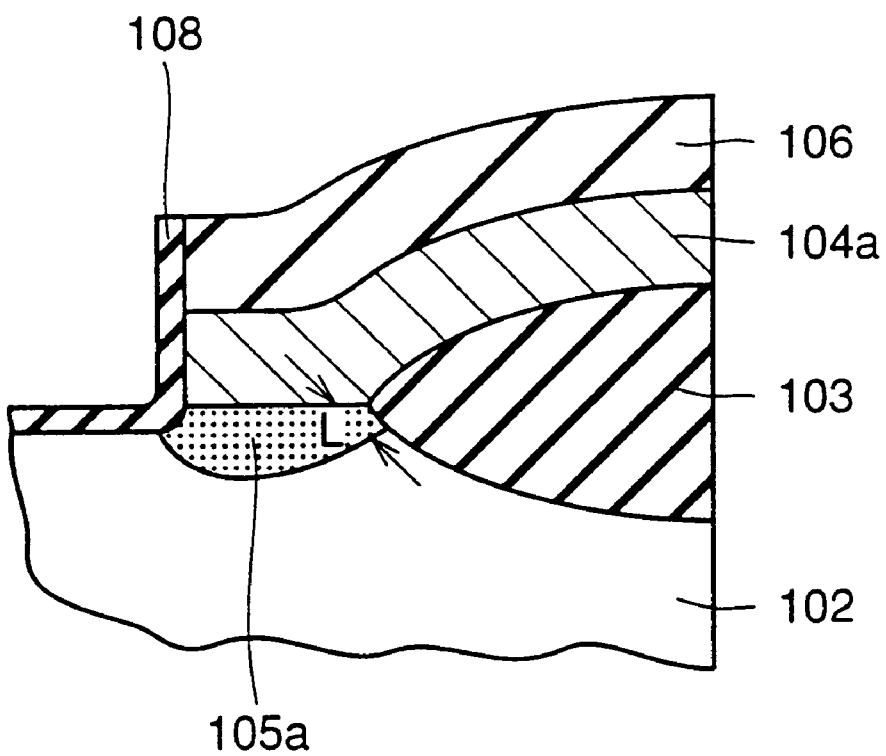
FIG. 29 is a partial cross section for illustrating a disadvantage of the conventional semiconductor device manufacturing method.

Referring now to FIG. 17, a film (not shown) of metal, such as aluminum, is formed on interlayer insulating film 49 to fill each of contact holes 50a–50g. A predetermined photoresist pattern (not shown) is formed on the metal film. The photoresist pattern is used as a mask for anisotropically etching the metal film to form a collector interconnection 30, an emitter interconnection 31 and a base interconnection 32 in element forming region A, and interconnections 51, 52, 53 and 54 in element forming regions B and C.

A silicon oxide film 55 is formed on interlayer insulating film 49 to cover collector, emitter and base interconnections 30, 31 and 32, and interconnections 51–54. A predetermined metal interconnection 56 is further formed on silicon oxide film 55. A protection film (not shown) is formed on metal interconnection 56. A semiconductor device including a bipolar transistor and a MOS transistor is thus completed.

According to the manufacturing method described above, a bipolar transistor formed in element forming region A allows, as has been described in the first embodiment, improvement in the breakdown voltage between external base 18 and n silicon epitaxial layer 36$a$ as an emitter and hence reduction of current leakage.

Also, an n-channel MOS transistor formed in element forming region B allows p-channel dope 40 to restrict punch through caused in the n-channel MOS transistor. Punch through is a phenomenon that depletion layers expanding from the respective junction interfaces between n$^-$ and n$^+$ source/drain regions 44$a$ and 44$b$ and 45$a$ and 45$b$ and p silicon epitaxial layer 36$b$ are linked together and current is thus allowed to flow between the source and the drain without a channel. P-channel dope 40, located in the vicinity of n$^-$ and n$^+$ source/drain regions 44$a$ and 44$b$ and 45$a$ and 45$b$, restricts expansion of depletion layers from the respective junction interfaces to prevent the both depletion layers from being linked together. As a result, punch through is restricted.

Furthermore, p-channel cut 39 formed exactly under field oxide film 6$b$ can restrict formation of a parasitic channel exactly under field oxide film 6$b$ and thus allows stable electrical characteristics of the n-channel MOS transistor.

Particularly in the present structure, p-channel cut 39 and p-channel dope 40 further improve the electrical insulation between the bipolar transistor and the n-channel MOS transistor that are adjacent to each other.

Furthermore, the ion injection for forming p-channel dope 40 and p-channel cut 39 can be provided simultaneously with the boron ion injection in forming external base 18. Thus, while the number of process steps is not increased, a semiconductor device can be formed which is capable of reduction of current leakage and includes a bipolar transistor and a MOS transistor superior in electrical insulation.

While in the above embodiments boron (B) ions are injected as a p impurity, boron fluoride (BF$_2$) ions may be injected.

Furthermore, a structure with the conduction type of each region inverted is similarly applicable and can achieve the effects described above in each of the above embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming at a main surface of a semiconductor substrate a first element forming region formed of a first region of a first conduction type electrically insulated from another region by a first element isolating film;

forming a first photoresist pattern across said first element isolating film and said first element forming region such that a portion of a surface of said first element isolating film and a portion of a surface of said region of said first conduction type are continuously exposed; and forming a first impurity region of a second conduction type in said first region of said first conduction type at a region including a main surface of said region of said first conduction type and a portion exactly underlying said first element isolating film and a portion in a vicinity of said portion exactly underlying said first element isolating film, by using said first photoresist pattern as a mask and introducing an impurity of a second conduction type into said region of said first conduction type.

2. The method of manufacturing a semiconductor device according to claim 1, wherein the step of forming said first impurity region is followed by the steps of:

forming at a main surface of said first element forming region a second impurity region of said second conduction type electrically connected to said first impurity region and lower in impurity concentration than said first impurity region; and forming a third impurity region of said first conduction type in said second impurity region at a main surface of said first element forming region, said third impurity region being shallower than said second impurity region.

3. The method of manufacturing a semiconductor device according to claim 2, comprising the steps of:

forming at a main surface of said semiconductor substrate a second element forming region formed of a region of said second conduction type electrically insulated from another region by a second element isolating film;

forming a second photoresist pattern across said second element isolating film and said second element forming region such that a surface of said second element isolating film and a surface of said region of said second conduction type are continuously exposed; and forming a fourth impurity region of said second conduction type higher in impurity concentration than said region of said second conduction type in said region of said second conduction type at a region including a portion exactly underlying said second element isolating film and a portion in a vicinity of said portion exactly underlying said second element isolating film, by using said second photoresist pattern as a mask and introducing an impurity of said second conduction type into said region of said second conduction type; wherein:

the step of forming said first photoresist pattern is provided simultaneously with the step of forming said second photoresist pattern; and the step of forming said fourth impurity region and the step of forming said first impurity region are simultaneously provided by using said first and second photoresist patterns as a mask and introducing said impurity of said second conduction type.

4. The method of manufacturing a semiconductor device according to claim 1, comprising the steps of:

forming at a main surface of said semiconductor substrate a second element forming region formed of a region of said second conduction type electrically insulated from another region by a second element isolating film;

forming a second photoresist pattern across said second element isolating film and said second element forming region such that a surface of said second element isolating film and a surface of said region of said second conduction type are continuously exposed; and forming a fourth impurity region of said second conduction type higher in impurity concentration than said region of said second conduction type in said region of said second conduction type at a region including a portion exactly underlying said second element isolating film and a portion in a vicinity of said portion exactly underlying said second element isolating film, by using said second photoresist pattern as a mask and introducing an impurity of said second conduction type into said region of said second conduction type; wherein:

the step of forming said first photoresist pattern is provided simultaneously with the step of forming said second photoresist pattern; and the step of forming said fourth impurity region and the step of forming said first impurity region are simultaneously provided by using said first and second photoresist patterns as a mask and introducing said impurity of said second conduction type.

* * * * *

UNITED STATES PATENT AND TRADEMARK OFFICE
CERTIFICATE OF CORRECTION

PATENT NO.    : 6,225,180 B1
DATED         : May 1, 2001
INVENTOR(S)   : Hidenori Fujii It is certified that error appears in the above-identified patent and that said Letters Patent is hereby corrected as shown below:

<u>Title page,</u>
Item [30] Foreign Application Priority Data", change "Jan. 19, 1998" to -- Jan. 16, 1998 --.

Signed and Sealed this

Twenty-ninth Day of January, 2002

Attest:

Attesting Officer

JAMES E. ROGAN
*Director of the United States Patent and Trademark Office*